LAMINATED PRINTED CIRCUIT AND METHOD OF MAKING

Filed Aug. 22, 1961 2 Sheets-Sheet 1

INVENTOR.
BURTON D. MORGAN
BY Oldham & Oldham
ATTYS.

March 15, 1966 B. D. MORGAN 3,240,647

LAMINATED PRINTED CIRCUIT AND METHOD OF MAKING

Filed Aug. 22, 1961 2 Sheets-Sheet 2

INVENTOR.
BURTON D. MORGAN
BY Olsen & Olsen
ATTYS.

United States Patent Office 3,240,647

Patented Mar. 15, 1966

3,240,647

LAMINATED PRINTED CIRCUIT AND METHOD OF MAKING

Burton D. Morgan, Hudson, Ohio, assignor to Morgan Adhesives Company, Stow, Summit, Ohio, a corporation of Ohio Filed Aug. 22, 1961, Ser. No. 133,238
5 Claims. (Cl. 156—249)

The present invention relates to so-called printed circuits, and to a novel and improved laminated printed circuit and to a method of making a plurality of repetitive circuits by a continuous operation from a plurality of layers of insulation, conductive material, carrier sheets and the like.

Heretofore there have been various processes provided for forming printed electrical circuits and various ones of these processes have gone into extensive commercial use. Substantially all of these processes are relatively expensive, or they may leave some or all of the wires in the circuit exposed and not insulated in the proper manner, or it may de difficult to apply these printed circuits to some articles, panels, or other products, such as may be used for example in a motor vehicle, aircraft, or the like, or they may be objectionable for other reasons.

The general object of the present invention is to provide a novel and improved laminated printed circuit and to provide a method of making such laminated printed circuit from a plurality of layers of insulating material, conductive material, carrier or backing sheets, and the like.

A further object of the invention is to build up a laminated printed circuit from two separate but continuous strips, one of insulating material and associated members, and the other continuous strip being made from conductive material adhesively secured to a carrier or backing sheet, or the like.

Yet another object of the invention is to provide a process for repeatedly forming a repetitive printed circuit on longitudinally spaced portions of continuously moving sheets, and where the sheets can be cut into individual circuits for individual application to desired articles at a convenient time in the assembly of the articles.

A further object of the invention is to provide a laminated printed circuit having a continuous insulation paper on the top surface thereof and with a releasable continuous backing sheet being the lower surface of the laminated circuit article, an adhesive layer being provided on the layer of the laminated circuit adjacent the backing sheet whereby when the backing sheet has been removed, the adhesive can be used to secure the printed circuit in place by forcing the circuit against a suitable carrier member sheet, or the like.

The foregoing and other objects and advantages of the invention will be made more apparent as the specification proceeds.

Figures 1, 2, 3, 4, 5, 6, 7:
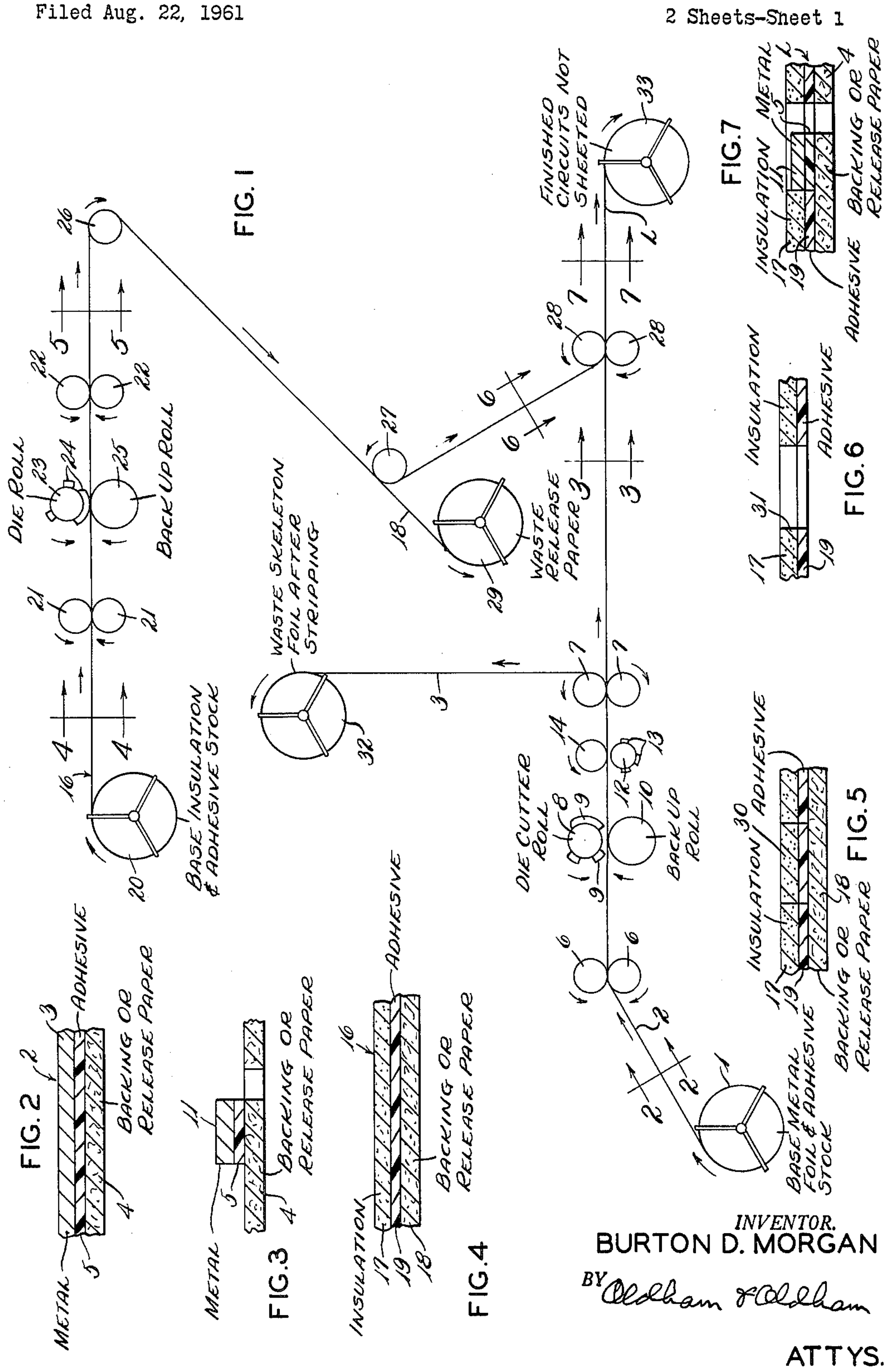
Figure 8:
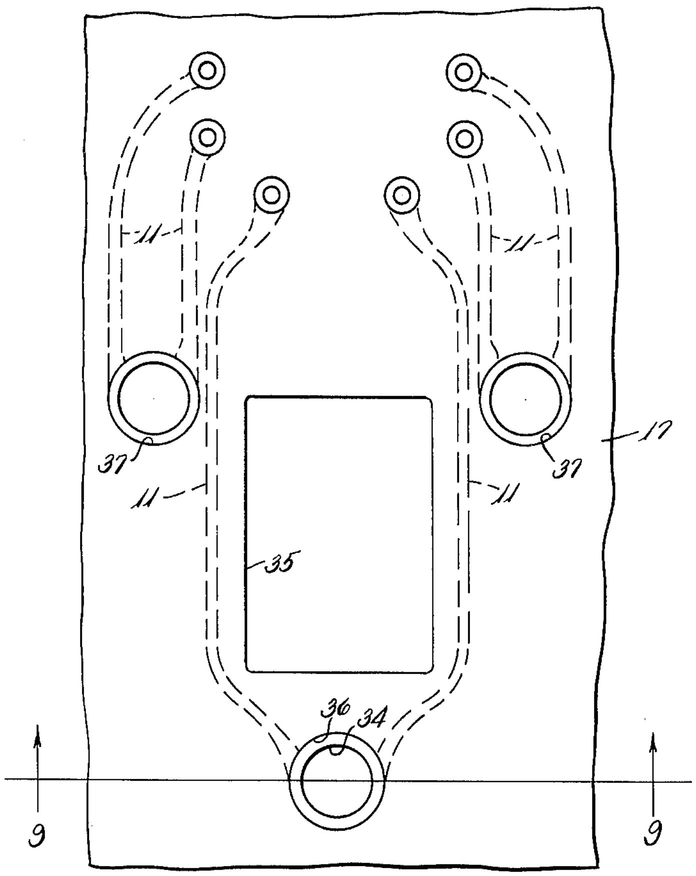
Figure 9:
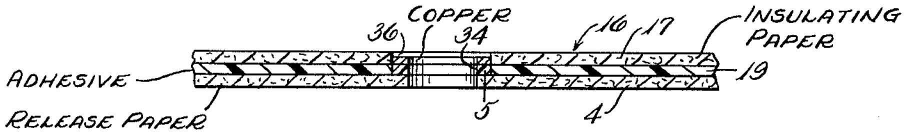

Reference now is particularly directed to the accompanying drawings wherein:

FIG. 1 is a diagrammatic showing of apparatus for practicing a method involving the principles of the invention;

FIGS. 2 through 7 are enlarged vertical sections taken on lines 2—2 through 7—7 respectively, of FIG. 1 to show the material being processed;

FIG. 8 is a plan view of a typical printed circuit during its process of manufacture; and FIG. 9 is a vertical section taken on line 9—9 of FIG. 8.

When referring to corresponding members shown in the drawings and referred to herein, corresponding numerals are used to facilitate comparison therebetween.

The present invention, generally speaking, relates to the continuous forming of a repetitive printed circuit and the method comprises the steps of continuously moving a laminate of a metal foil sheet adhesively secured to a backing sheet through a controlled path, processing portions of the metal foil sheet to sever the desired printed circuit sections therefrom, stripping the metal foil sheet from the backing sheet and leaving the printed circuit portions thereon, moving a laminate of an insulating sheet adhesively secured to a backing sheet through a controlled path, cutting portions of the insulating sheet therefrom to correspond to or be complementary to portions of the printed circuit sections for exposing parts thereof when the insulating sheet and the printed circuit sections are superimposed, stripping the cut parts of the insulating sheet and its backing sheet from the continuous insulating sheet, and laminating the insulating sheet with the backing sheet and the printed circuit portions to register the insulation over portions of the circuit and expose parts of the circuit for contact with electrical members whereby the laminated printed circuit can be used by cutting the repetitive sections therefrom and stripping off the backing sheet to secure the resulting laminate to a base by the adhesive exposed thereon and provide an insulated printed circuit adhesively secured to a suitable carrier or base member.

Attention now is directed to the details of the novel method of the invention as shown in the accompanying drawings and where a storage reel 1 for a laminate 2 is provided. This laminate 2 comprises a suitable conductive foil sheet 3 secured to a backing or release paper sheet 4 by a conventional pressure sensitive layer of adhesive 5 carried by the foil sheet 3. Such laminate 2 is led through suitable guide rolls 6, 6 and 7, 7 to control the path of the laminate 2 and to set up any desired tension therein whereby the laminate 2 will be positively fed to and pulled from a cutter roll 8 having any suitable types of dies or cutters 9 carried on the periphery thereof to contact the laminate 2 and cut through the metal foil sheet 3 by forcing the laminate 2 against a suitable backing roll 1 associated with the cutter roll 8. The dies 9 carried by the cutter roll 8 are adapted to sever localized sections or strips, like a strip 11, from the remainder of the foil sheet 3 so that suitable printed circuit portions, strips, or the like can be cut from the foil sheet 3 for later use, as hereinafter described. The foil strip 3 may next pass to a punch roll 12 that has suitable cutters or punches 13 carried thereon and which are operatively associated with a backup roll 14 whereby apertures 15 can be formed to extend through the backing 4, when the continuous foil sheet 3 is stripped from the remainder of the laminate 2, as indicated in FIG. 3 of the drawings. These severed sections produced by the punch 13 will remain in adhesive engagement with the continuous foil sheet 3 when stripped from the remainder of the laminate. It will be noted that the punch roll 13 operates from the backing sheet side of the laminate 2, whereas the die cutter roll 8 operates from the foil sheet side of the laminate, and with the punch roll 12 only serving to cut into the laminate through the layer of adhesive 5 and not to cut through the foil sheet 3, when required. The cutter roll 8 functions in the opposite manner and only cuts through the foil sheet 3 through the adhesive layer 5 to facilitate formation of sharp edges on the printed circuit members.

As another important feature of the present invention, a second laminate 16 is provided and it is continuously moved through a controlled path of movement by the means described hereinafter in more detail. This laminate 16 is formed from a suitable continuous layer of insulation material 17, such as a relatively strong paper sheet, or a plastic film, and with a backing or release sheet 18 being adhesively secured to the insulation sheet 17 by a layer of pressure sensitive adhesive 19 of conventional composition. The adhesive 19 is initially applied to the insulation sheet 17 and is carried thereby when the release sheet 18 is stripped from the remainder of the continuous insulation sheet 17, as later described. Thus, FIG. 1 shows a reel 20 on which continuous lengths of the laminate 16 are received and are drawn therefrom between suitable guide rolls 21, 21 to be pulled therefrom for passage between a second pair of guide rolls 22, 22. In moving this laminate 16 between the guides 21 and 22, the laminate 16 is engaged by a die roll 23 which has suitable dies or cutters 24 carried in desired portions of its periphery for operative engagement with the laminate 16 as the laminate moves between such roll 23 and an associated backup roll 25. These cuts produced in the insulation sheet 17 by the dies 24 are complementary in shape to portions of the printed circuit sections or strips 11 so that the insulating sheet normally would expose only the end or other specified portions of these strips 11 when the insulation and printed circuit means are laminated into a unit. The insulation sheet hence will insulate the circuit means for the major portion of their lengths when the laminate 16 and laminate 2 are associated with each other, all as described hereinafter in more detail.

The laminate 16 may then be led around suitable additional guide rolls 26 and 27 and with the release sheet 18 being stripped from the remainder of the laminate 16 at any desired portion of its movement. The insulating sheet 17 is left as a continuous member that passes to a pair of laminating rolls 28, 28. The release sheet 18 is collected on a reel 29 as shown and such release sheet will carry the cut portions of the insulating sheet 17, as indicated at 30, with the release sheet for discard purposes and leave the insulating sheet with an aperture or slot 31, of FIG. 6, provided therein, which slot or aperture is complementary to the strip 11 so as to expose at least a portion thereof. The slot 31 may be of sufficient size as to extend beyond the strip 11, in case an aperture or slot is to be formed completely through the laminated printed circuit assembly. Such aperture completely through the final laminate of the invention facilitates applying the laminate produced over posts, or other frame members that interrupt a substantially flat surface to which the laminate printed circuit of the invention is to be applied when in use.

FIG. 1 of the drawings also shows that the laminate 2, after the continuous foil sheet 3 has been stripped therefrom, passes to the laminating rolls 28, 28 below the laminate 2. The laminate 16 has the adhesive layer 19 on the lower surface thereof and the continuous insulation sheet 17, that has had suitable apertures, slots, or other sections cut therefrom and removed with the release sheet 18, is ready for adhesive engagement with the remaining portions of the laminate 2 when forced into contact with each other through the laminating rolls 28, 28, and any suitable adjustable pressure provided thereby. The forced contact through the laminating rolls 28, 28 of the laminates 2 and 16 forms substantially a continuous pressure sensitive adhesive layer of the previously independent adhesive layers 19 and 5. This continuous layer combined with the relatively light weight of the laminate provides a sufficiently integral laminate L so that the release paper 4 can be carefully peeled off smoothly to prepare the circuit means for deposit.

The resulting laminate L then can be led to a storage reel 33 for deposit thereon.

It should be realized that the laminate L of the invention, as shown in FIG. 7, will have a repetitive printed circuit formed thereon at longitudinally spaced portions thereof. The actions of the dies or cutter means on the rolls 8 and 23 are naturally accurately correlated with each other and are suitably driven at the same surface speeds. The continuous backing, or release sheet 4 is still present in the laminate L, as is the continuous insulating sheet 17. Thus if desired, the strip could be immediately severed into repetitive printed circuit sections, and the backing or release paper 4 could be thereafter removed from the laminate so that the remaining structure could be pressed against a suitable carrier board or panel to have the circuit assembled to such carrier board panel for association of the desired electrical elements or components therewith.

FIG. 8 of the drawings best shows how a plurality of strips 11, 11 can be provided in a printed circuit assembly of the invention. These printed circuit strips 11 are shown as having portions of the strips 11 exposed by the insulation sheet 17 on the upper or end surfaces thereof for engagement with electrical components or members. The drawing also shows that apertures 34 and 35 may be formed completely through this laminate of the invention for receiving posts, studs or other members therethrough to apply the laminated printed circuit immediately thereadjacent. The insulation 17 is removed at annular areas 36 or sections 37, 37 where the printed circuit is to be exposed for electrical contact.

As indicated, when in use, the release or backing sheet 4 would be stripped from the remainder of the laminate L the components of which would be held in unitary association with each other by the insulating sheet 17 and the adhesive layer 19 which would serve for protective purposes on the printed circuit after it has been secured to a desired carrier board by the adhesive means originally forming the layers 5 and 19 in the individual laminates used for forming articles of the invention. Note with reference to FIG. 8 that almost the total areas of the strips 11 are beneath the insulation layer 17 and affixed to the pressure sensitive adhesive layer 19, except for limited end areas of the strips, as at 36. This provides the substantially integral structure between the insulation 17 and adhesive 5, even after the paper release layer 4 is removed.

It should be understood that the principles of the invention can be practiced in a variety of manners and that the thickness of the circuit components and insulation means, etc., may be varied. Rather than continuously moving the laminates past the cutter rolls for cutting and forming actions, it would be possible to move the laminates intermittently and have some type of a cutter die brought into contact with longitudinally spaced portions of the laminate for the desired cutting and outlining actions. Furthermore, it is possible to form the printed circuit portions of the metal foil sheet by some type of an acid etching process or the like where the laminate 2 could be intermittently or continuously fed through or be operatively associated with convention etching means so as to separate or cut the strips 11, 11 therefrom, or to sever them from the remainder of the sheet so that when the continuous foil sheet 3 would thereafter be stripped from the remainder of the laminate 2, the strips 11, 11 would be left in engagement with the backing sheet 4.

It also should be realized that any other operations as desired can be performed on the laminates 2 and 16 for cutting portions of a layer or layers of the laminate so that such portions can thereafter be removed from the remainder of the continuous insulating, or backing sheets, as required in forming the circuits of the invention.

Some laminates may be made by use of a cutter or punch roll, like the roll 12, which could sever holes, slots, etc. that pass through all layers of the laminate L after passing the rolls 28, 28.

It will be realized that accurate cutting of laminates through only certain layers thereof can be performed in known types of apparatus. The laminates 2 and 16 are superimposed when the processed, stripped or cut portions thereof are in exact vertical and lateral register whereby the desired printed circuit laminate is produced, as the portions of the circuit on the starting laminates have been accurately laid out and formed with relation to each other.

In view of the foregoing, it is believed that a novel and improved type of a laminated printed circuit has been provided, and that the objects of the invention have been achieved.

While one complete embodiment of the invention has been disclosed herein, it will be appreciated that modification of this particular embodiment of the invention may be resorted to without departing from the scope of the invention as defined in the appended claims.

What is claimed is:

1. That method of continuously forming a repetitive printed circuit comprising
   continuously moving a continuous laminate of a metal foil sheet adhesively secured to a backing sheet through a controlled path,
   cutting a printed circuit repetitively into the metal foil sheet at longitudinally spaced portions thereof,
   continuously stripping the metal foil sheet from the backing sheet but leaving the printed circuit foil sections thereon,
   continuously moving an insulating sheet having a backing sheet secured thereto by releasable adhesive on the insulating sheet through a controlled path,
   cutting repetitive portions of the insulating sheet therefrom to correspond to portions of the printed circuit to be exposed for use in the laminate to be produced,
   continuously stripping the backing sheet from the continuous insulating sheet and carrying the cut portions of the insulating sheet therewith, and
   continuously laminating by said releasable adhesive on the insulating sheet corresponding portions of the insulating sheet with equivalent portions of the metal foil and its backing sheet whereby the laminate can be used by cutting repetitive sections therefrom and stripping off the backing sheet to secure the laminate to a base and provide an insulated printed circuit thereon.

2. That method of continuously forming a repetitive printed circuit comprising
   continuously moving a laminate of a metal foil sheet adhesively secured to a backing sheet through a controlled path,
   cutting a printed circuit repetitively into the metal foil sheet,
   continuously stripping the metal foil sheet from the backing sheet but leaving the printed circuit foil sections thereon,
   continuously moving an insulating sheet having an adhesive layer thereon through a controlled path,
   cutting repetitive portions of the insulating sheet therefrom to correspond to portions of the printed circuit to be exposed for use in the laminate to be produced,
   continuously laminating corresponding portions of the insulating sheet with equivalent portions of the metal foil and its backing sheet by bringing the adhesives layer on said insulating sheet into engagement with said metal foil, and
   continuously winding up the laminate whereby it can be used by cutting the repetitive sections therefrom and stripping off the backing sheet to secure the laminate to a base and provide an insulated printed circuit thereon.

3. That method of continuously forming a repetitive printed circuit comprising
   moving a laminate of a metal foil sheet adhesively secured to a removable backing sheet through a controlled path,
   processing portions of the metal foil sheet to form printed circuit sections therein,
   stripping the metal foil sheet from the backing sheet but leaving the printed circuit foil sections thereon,
   moving an insulating sheet, having a backing sheet secured thereto by a releasable adhesive layer on the insulating sheet, through a controlled path,
   cutting longitudinally repetitive portions of the insulating sheet therefrom to correspond to portions of the printed circuit to be exposed for use in the laminate to be produced,
   stripping the backing sheet from the insulating sheet and carrying the cut portions of the insulating sheet therewith, and
   laminating corresponding portions of the insulating sheet with equivalent portions of the metal foil and its backing sheet by applying the metal foil sections to the releasable adhesive layer of said continuous insulating sheet whereby a printed circuit laminate having the removable backing sheet of said metal foil sheet thereon is provided.

4. That method of providing a printed circuit comprising the steps of forming a laminate of a continuous metal foil sheet adhesively secured to a backing sheet,
   processing portions of the metal foil to sever printed circuit sections therefrom,
   stripping the continuous metal foil sheet from the backing sheet and leaving the printed circuit portions thereon,
   forming a laminate of an insulation sheet adhesively secured to a backing sheet,
   cutting portions of the insulating sheet therefrom complementary to portions of the printed circuit for exposing parts thereof when the insulating sheet and the printed circuit are superimposed,
   stripping the cut parts of the insulating sheet and the backing sheet therefrom, and
   laminating the insulating sheet with the backing sheet and printed circuit portions to register the insulation over portions of the circuit and expose portions thereof for contact of electrical members therewith.

5. That method of continuously forming a repetitive printed circuit comprising
   continuously moving a continuous laminate of a metal foil sheet adhesively secured to a backing sheet by a pressure sensitive adhesive on the metal foil through a controlled path,
   forming a printed circuit repetitively in the metal foil sheet at longitudinally spaced portions thereof,
   continuously stripping the metal foil sheet from the backing sheet but leaving the printed circuit foil sections thereon,
   continuously moving an insulating sheet having a backing sheet secured thereto by a pressure sensitive adhesive on the insulating sheet through a controlled path,
   cutting repetitive portions of the insulating sheet therefrom to correspond to portions of the printed circuit foil sections to be exposed in use,
   continuously stripping the backing sheet from the continuous insulating sheet and carrying the cut portions of the insulating sheet therewith, and
   superimposing corresponding portions of the continuous insulating sheet with equivalent portions of the metal foil and its backing sheet and adhesively securing such sheets together whereby the laminate can be used by cutting repetitive sections therefrom and stripping off the backing sheet to secure the laminate to a base by the pressure sensitive adhesives to provide an insulated printed circuit thereon.

References Cited by the Examiner

UNITED STATES PATENTS 2,969,300 1/1961 Franz ____________ 156—261

EARL M. BERGERT, *Primary Examiner.*

ALEXANDER WYMAN, *Examiner.*